United States Patent
Sheng et al.

(10) Patent No.: US 8,164,879 B2
(45) Date of Patent: Apr. 24, 2012

(54) STEP DOWN DECHUCKING

(75) Inventors: Terry Sheng, Saratoga, CA (US); Peter Mok, Fremont, CA (US); Jason Hong, San Jose, CA (US); Steven Fong, San Jose, CA (US); Gongyuan Qu, San Jose, CA (US)

(73) Assignee: Advanced Ion Beam Technology, Inc., San Jose, CA (US)

( * ) Notice: Subject to any disclaimer, the term of this patent is extended or adjusted under 35 U.S.C. 154(b) by 435 days.

(21) Appl. No.: 12/417,625

(22) Filed: Apr. 2, 2009

(65) Prior Publication Data
US 2010/0254063 A1    Oct. 7, 2010

(51) Int. Cl.
*H01L 21/683* (2006.01)
(52) U.S. Cl. ........................... 361/234; 361/233
(58) Field of Classification Search .................. 361/234, 361/233
See application file for complete search history.

(56) References Cited

U.S. PATENT DOCUMENTS

| | | | |
|---|---|---|---|
| 5,491,603 A * | 2/1996 | Birang et al. | 361/234 |
| 2009/0109595 A1 * | 4/2009 | Herchen et al. | 361/234 |

* cited by examiner

*Primary Examiner* — Rexford N Barnie
*Assistant Examiner* — Angela Brooks
(74) *Attorney, Agent, or Firm* — Stout, Uxa, Buyan & Mullins, LLLP

(57) ABSTRACT

A method and an apparatus for dechucking an electrostatic chuck are disclosed. The gas escapes through an opening between a wafer and a chuck in each stage of a multi-stages process. In each stage, during at least a portion of the stage, the chucking voltage is reduced to a value less than the least threshold voltage needed for holding the wafer, so that the wafer is pushed away from the chuck by the gas. Hence, the gas can escape from an opening between the wafer and the chuck, thereby increasing the dechucking rate. By controlling the decrement and/or the duration of the reduced voltage, any potential damages due to the pushed-away wafer can be minimized.

18 Claims, 5 Drawing Sheets

STEP DOWN DECHUCKING

FIELD OF THE INVENTION

The present invention relates to a method and an apparatus for dechucking a workpiece, and more particularly, although not exclusively, for dechucking a wafer from an electrostatic chuck.

DESCRIPTION OF RELATED ART

An electrostatic chuck (ESC) is employed to hold workpieces such as semiconductor wafers in a vacuum chamber for an ion implantation process or other manufacturing processes. The electrostatic chuck is superior to mechanical clamping devices for avoidance of the need of fingers or other clamping mechanisms, which may damage the wafers or add particles to the surfaces of wafers. Moreover, mechanical clamping also usually requires 3~5 mm wafer edge exclusion whereas an electrostatic chuck usually requires at most 1~2 mm wafer edge exclusion. The principle used for an electrostatic chuck is to apply a voltage to one or more electrodes in the chuck so as to induce opposite polarity charges in the workpiece and electrode(s). The electrostatic attractive force between the opposite charges attracts the workpiece against the chuck, thereby holding the workpiece. FIG. 1 illustrates a conventional electrostatic chuck 10 for holding a wafer 13. The exemplary conventional electrostatic chuck 10 has only one electrode 11 connected to a DC source 12, and an insulating layer 14 is disposed between the wafer 13 and the electrode 11. When the DC source 12 applies a high voltage to the electrode 11, opposite polarity charges are induced in the top surface of the wafer 13, and the wafer 13 can be held on the electrostatic chuck 10 by the electrostatic attractive force.

The electrode 11 may be arranged in a recess of an insulating portion 15. In addition, a gas may be applied to the back surface of the wafer 13 via conduits 16 for controlling the wafer temperature (or for removing heat from the wafer), and a chiller system, such as a water chiller system, may be applied via conduits 17 to improve the heat conduction between the wafer 13 and electrostatic chuck 10. The gas can be referred to or comprise, for example, a heat-transfer gas. Conduits 16 and 17 may include a multitude of grooves or pipelines (not shown) extending within the electrostatic chuck 10.

"Dechucking" is a process that removes the workpiece from the electrostatic chuck and that presents important issues in the relevant field. When the manufacturing process in the vacuum chamber is finished, the workpiece is better removed away from the electrostatic chuck as soon as possible such that throughput can be increased.

In U.S. Pat. No. 5,459,632, Birang et al. disclose a semiconductor wafer dechucking method, wherein a dechucking voltage applied to a monopolar chuck electrode has the same polarity as the polarity of the voltage used to maintain the wafer in a chucked position. The dechucking voltage has a magnitude different from the chucking voltage to minimize the electrostatic attractive force between the chuck and wafer. An "optimum" value for the dechucking voltage is determined empirically or by monitoring the amplitude of a current pulse produced as the wafer is initially mounted on the chuck.

In U.S. Pat. No. 7,196,896, Howald et al. disclose a workpiece dechucked from a monopolar electrostatic chuck by gradually reducing the chucking voltage during processing while maintaining the voltage high enough to clamp the workpiece. A reverse polarity voltage applied to the chuck at the end of processing assists in dechucking. The workpiece temperature is maintained at a high value at the end of processing to assist in dechucking. Peak current flowing through the chuck during lifting of the workpiece from the chuck controls the amplitude and/or duration of the reverse polarity voltage during the next dechucking operation.

In U.S. Pat. No. 6,628,500, Thomas et al. provide a dechucking method that comprises the steps of: (a) reducing a residual chucking force due to the electrostatic chuck polarization; (b) contracting the chuck while the substrate is attached thereto with a plasma for a time sufficient substantially to remove any residual charge from the surface of the substrate and the chuck; and (c) subsequently to, or simultaneously with, step (b), removing the substrate from the chuck.

The dechucking approaches proposed by these prior art endeavors usually require sophisticated measurements or complicated mechanisms. Generally, such dechucking methods are addressed or implemented in connection with cancellation of residual electrostatic polarization or residual free charges, with no attention or less attention being paid to the dechucking velocity. It has been found that these methods do not or may not work in an entirely satisfactory manner, as they do not address the issue of the dechucking velocity when the wafer is removed.

With regard to dechucking velocity, it is typically limited by the inability to pump the gas out in a very short period of time. For instance, after the manufacturing process is finished, the wafer backside gas (BSG) is pumped out, and the chucking voltage applied to the electrode should be turned off as well. However, if the chucking voltage applied to the electrode is totally shut down at once, the electrostatic attractive force suddenly disappears. When the depletion of residual BSG pressure is not fast enough, the residual or remaining BSG at the back surface of the wafer can actually provide an exaggerated repulsive force to push the wafer away from the electrostatic chuck. The pushed wafer may collide with neighboring hardware, causing damage and/or scaring on the surface of the wafer. Further, the wafer may be pushed sufficiently far away from a predetermined position such that a robot arm cannot correctly catch the wafer.

As an example, for a 12-inch wafer, a conventional electrostatic chuck may need 10 to 15 seconds to completely release the gas. In other words, the electrostatic chuck must wait for 10 to 15 seconds before the chucking voltage can be completely turned off. The throughput therefore cannot be increased as a consequence of this problem. Even though solutions have been proposed to accelerate the release of the residual gas, those methods usually require modification of the structure of the electrostatic chuck and its electronic connections, and thus the cost is increased.

Therefore, it would be advantageous to provide a method and an apparatus for improving these and potentially other deficiencies of the prior art.

SUMMARY OF THE INVENTION

One embodiment of the invention provides a method for dechucking an electrostatic chuck, comprising: (a) holding a wafer with an electrostatic chuck, wherein a gas is located in a space between the wafer and the electrostatic chuck, wherein a repulsion applied on the wafer by the gas is less than an attraction applied on the wafer by at least a voltage of the electrostatic chuck; (b) reducing the voltage of the electrostatic chuck, such that the wafer is pushed away from the electrostatic chuck and at least a portion of the gas escapes; (c) increasing the voltage of the electrostatic chuck, such that a repulsion applied on the wafer by a residual gas is less than an attraction applied on said wafer by at least the voltage; (d) repeating steps (b) and (c) until a final residual gas located in the space has a final pressure value less than a threshold pressure value; and (e) moving the wafer away from the electrostatic chuck.

Another embodiment provides a method for dechucking an electrostatic chuck, comprising: (a) holding a wafer with an electrostatic chuck, wherein a gas is located in a space between the wafer and the electrostatic chuck, wherein a repulsion applied on the wafer by the gas is less than an attraction applied on the wafer by at least a voltage of the electrostatic chuck; (b) reducing the voltage of the electrostatic chuck, such that the wafer is pushed away from the electrostatic chuck and at least a portion of the gas escapes; (c) holding the wafer by the electrostatic chuck again when a repulsion applied on the wafer by a residual gas located in the space is less than an attraction applied on the wafer by at least the voltage; (d) repeating steps (b) and (c) until a final residual gas located in the space has a final pressure value less than a threshold pressure value; and (e) moving the wafer away from the electrostatic chuck.

The dechucking methods are preferably applied to an implanter, as embodiments, wherein the implanter comprises an ion source assembly for generating an ion source, an extracting assembly for extracting a plurality of ions from the ion source, an analysis magnetic assembly for adjusting the ions into an ion beam and a mechanical assembly for supporting and moving a wafer to be implanted by the ion beam. The mechanical assembly can comprise an electrostatic chuck for holding the wafer, and the implanter (e.g., the mechanical assembly) may further comprise a controller capable of controlling at least a portion of the implanter to adjust the chucking voltage of the electrostatic chuck.

DESCRIPTION OF THE PREFERRED EMBODIMENT

Figure 1:
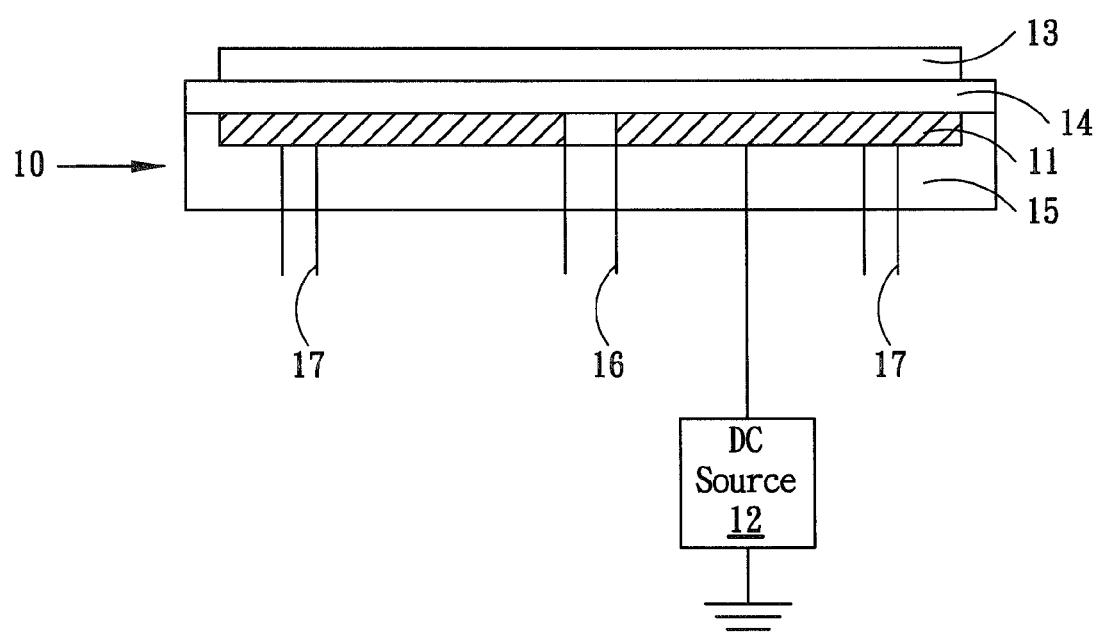
FIG. 1 is a diagram illustrating a standard electrostatic chuck according to the prior art.

A detailed description of the present invention will now be provided with reference to the following embodiments, which are not intended to limit the scope of the present invention and which can be adapted for other applications. While the drawings are illustrated with a degree of detail, it is appreciated that the quantity of the disclosed components may be greater or less than that disclosed, except for instances expressly restricting the amount of the components. Wherever possible, the same or similar reference numbers are used in the drawings and the description to refer to the same or like parts. It should be noted that the drawings presented are in simplified form and are not to precise scale.

Figure 2A:
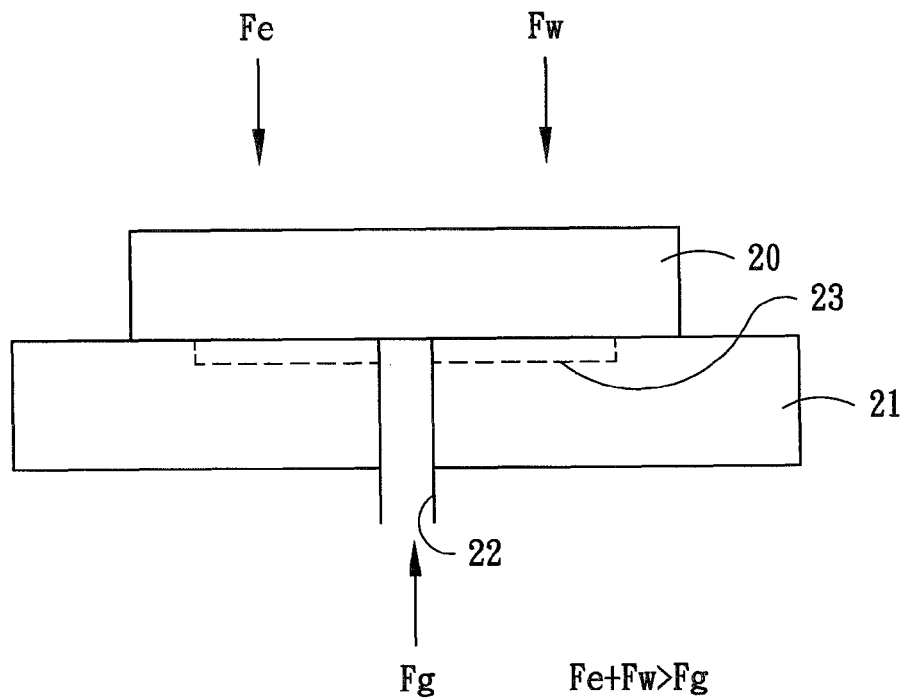
FIGS. 2A and 2B are diagrams illustrating a concept of a dechucking method according to the present invention.
Figure 2B:
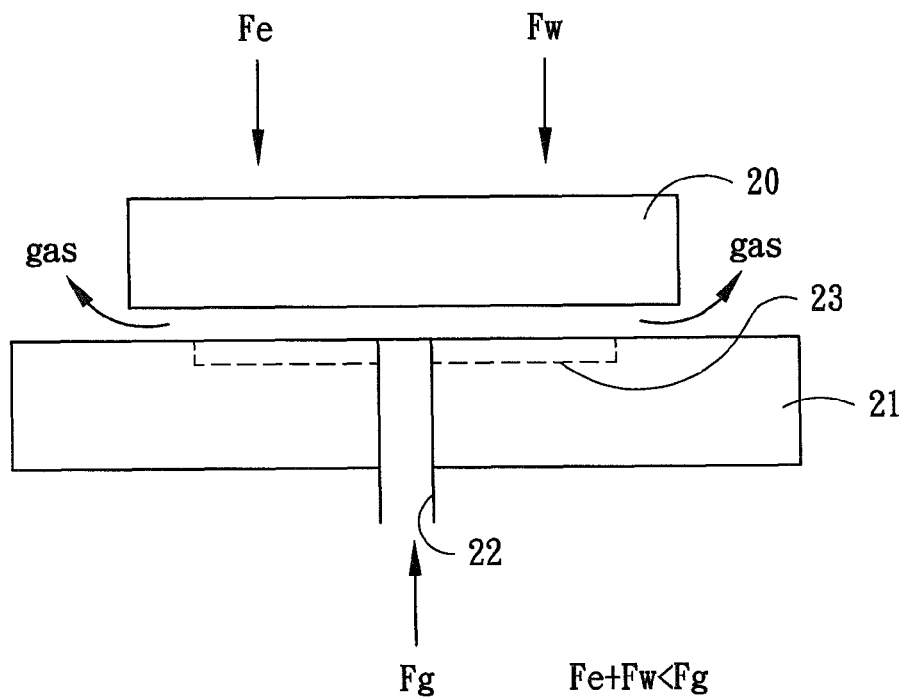

The invention herein devised is based at least in part upon a new concept and method whereby a heat-transfer gas can be controllably (e.g., relatively quickly) released. FIG. 2A and FIG. 2B illustrate the concept. As shown in the figures, a chucking voltage applied to electrode(s) contributes an electrostatic attractive force (denoted by Fe), the weight of a wafer as a gravity force can be (e.g., is) also deemed the attractive force (denoted by Fw), and the gas pushing a back surface of the wafer contributes a repulsive force (denoted by Fg). In FIG. 2A and FIG. 2B, reference number 20 denotes the wafer, reference number 21 denotes an electrostatic chuck, reference number 22 denotes a conduit extending within the electrostatic chuck 21 for pipelining the gas, and reference number 23 denotes a groove of the conduit 22. It is appreciated that other components are omitted for simplicity.

As shown in FIG. 2A, when a sum of electrostatic attractive force and the gravity force of the wafer is greater than the repulsive force (Fe+Fw>Fg), a net repulsion applied on the wafer can be smaller than a net attraction applied on the wafer, and (e.g., whereby) the gas can be sealed within a space between the wafer 20 and the chuck 21. As shown in FIG. 2B, when the sum is smaller than the repulsive force (Fe+Fw<Fg), the net repulsion applied on the wafer can be larger than the attraction applied on the wafer, and (e.g., whereby) the wafer 20 can move (e.g., be pushed) away from the electrostatic chuck 21, whereby in the meantime at least a portion of the gas can escape through an opening between the wafer 20 and the chuck 21.

The opening between the wafer 20 and the chuck 21 thus can provide a channel for the gas to be released. By reducing or shutting down (e.g., abruptly, too-quickly, non-iteratively, and/or otherwise non-controllably reducing or shutting down) the chucking voltage applied to the electrode(s), the wafer 20 may be pushed away from the predetermined location to such a degree that either a robot arm may not be able to control (e.g., hold, catch, or maintain a grip on or control over) the wafer 20 and/or the wafer 20 collides with other hardware. However, the above-mentioned risks can be attenuated or minimized by controlling the variation of the voltage to an acceptable extent, such that, for example, potential damage or scarring (e.g., or susceptibility to or vulnerability to scarring) induced by a collision can be reduced or minimized and/or the robot arm still can control (e.g., hold) the wafer. To this end, the present invention provides two approaches for controlling the variation of the voltage to form an opening between the wafer and the electrostatic chuck for allowing leaking of the gas under greater monitoring, iterative or feedback steps, and/or control (e.g., more quickly).

Herein, owing to the weight of the wafer being fixed, the below embodiments are essentially focused only on the relation between the electrostatic attractive force and the repulsive force provided by gas. However, it is well-known to add the effect of the wafer weight, and/or even other factors such as the friction between the wafer 20 and the chuck 21. For example, to push away the wafer, it is well-known to those skilled in the art that the repulsive force can not only be larger than the electrostatic attractive force, but also has to be larger than at least the sum of the electrostatic attractive force and the wafer weight force.

Figure 3:
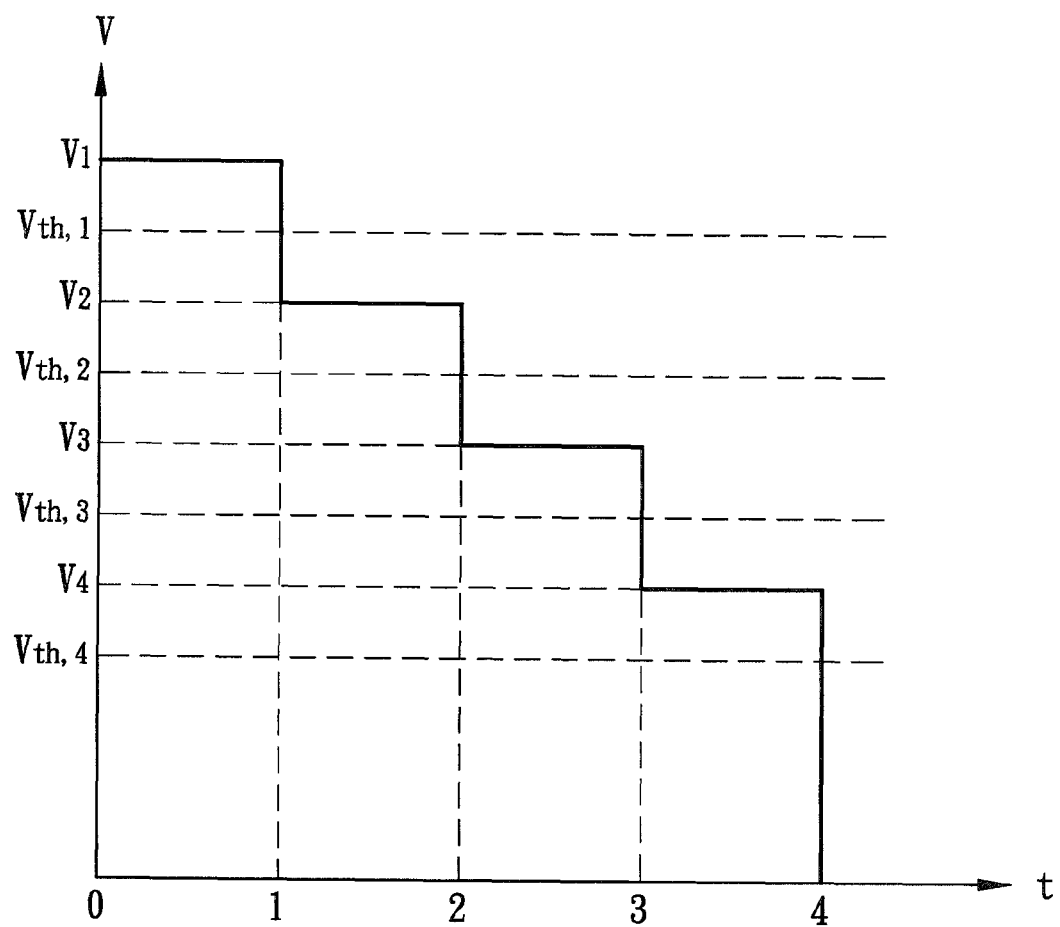
FIG. 3 is a diagram illustrating a first embodiment of the dechucking method according to the present invention.

FIG. 3 illustrates a dechucking method according to a first embodiment of the present invention, where symbol V denotes the chucking voltage (volts) applied to the electrode(s), and symbol t denotes the time whereby t can be any unit. A parameter Vth, least threshold voltage, is defined as the least voltage needed for holding the wafer against the electrostatic chuck. Since the gravity force of the wafer is a constant value, the only controllable one of these variables may be the chucking voltage applied to the electrode(s). In the first embodiment the chucking voltage is reduced (e.g., gradually reduced) iteratively (e.g., in multi-stages), such as, in a preferred implementation, by changing (e.g., adjusting or properly adjusting) the amount (e.g., decrement) of the voltage of multiple stages (e.g., each stage) so that at said stages (e.g., each stage) a portion of the gas escapes through the opening between the wafer and the electrostatic chuck.

To leak the gas out from the opening between the wafer and the electrostatic chuck, at each stage the chucking voltage must be reduced to a value less than the least threshold voltage Vth. Once the chucking voltage is less than the least threshold voltage, the electrostatic attractive force Fe plus the gravity force of the wafer Fw will be smaller than the repulsive force Fg, and then the wafer will be pushed away from the electrostatic chuck. Of course, the decrement of the chucking voltage must be controlled to an extent that the displacement of the wafer is small and acceptable, such that any damage and scar are minimized and the robot arm can hold the wafer.

The threshold voltage is a variable that tends to be (e.g., is) changed after a portion of the gas escapes, because the quantity of the residual or remaining gas is smaller than the quantity of the gas before the escape. For example, when t=0, the chucking voltage V1 applied to the electrode(s) is larger than the threshold voltage Vth, 1, so that the wafer is held on the wafer. When t=1, the chucking voltage is reduced to V2 smaller than the threshold voltage Vth, 1, so that the wafer is pushed away from the electrostatic chuck and a portion of the gas escapes from the opening. After that, because the repulsive force gets smaller, the threshold voltage gets smaller as well. In other words, the threshold voltage Vth, 1 is therefore changed to the threshold voltage Vth, 2. Herein, for each stage, owing to the wafer being firstly pushed away until the repulsive force is equal to the attractive force, there is still an opening when the two forces are balanced. Hence, some gases will still leak through the openings because the wafer is located in a vacuum environment. Then, the repulsive force provided by the residual gas will be smaller than the attractive force, such that the wafer is caught by the chuck again. Clearly, owing to the residual gas not being able to push away the wafer, the threshold voltage corresponding to the residual gas will be smaller than voltage of the chuck. For example, in the second stage, the second threshold voltage Vth, 2 is smaller than the second chuck voltage V2.

The above-mentioned step is repeated in each of stages 2, 3, 4, and so on, until the value of threshold voltage is very (e.g., acceptably, according to a stored value) low, for example, approximating 0V or equaling 0V. The very low threshold voltage means that the presence (e.g., quantity) of the residual gas is of a nature (e.g., so small, or to an extent) that the residual gas is unable to push away the wafer or to push the wafer to an undesirable degree, obviously far, or beyond control of the system (e.g., implanter). In other words, this means that the very low threshold voltage means the residual gas has a final pressure value less than a threshold pressure value, where the threshold pressure value is defined as the least pressure needed to push (e.g., undesirably push) the wafer away from the electrostatic chuck when the chucking voltage is totally turned off. It also means that the threshold pressure value may be defined as the most pressure to push away the wafer from the electrostatic chuck so that (e.g., to an extent that) damage is minimized and the robot arm can still catch the wafer, when the chucking voltage is totally turned off. In the later case, the threshold pressure value corresponds to a final threshold voltage, Vth, f, (not shown), which is defined as the least voltage needed to hold the wafer against the electrostatic chuck when the residual gas has a threshold pressure value. Supposing that at stage 4 the threshold voltage Vth, 4 is small enough, the chucking voltage V4 may be reduced to zero at this stage, because the threshold voltage will be lowered down to almost zero after a portion of the gas escapes. Then, it is suitable to move the wafer away from the chuck. Note that the number of the stages is not limited.

Besides, in order to further enhance the dechucking velocity, the embodiment may further comprise one or more of the following steps: First, during and/or between two or more (e.g., each) of the stages of the step-down dechucking method mentioned above, continually pump gas out as usual. Second, before the step of moving the wafer, reduce the voltage of the wafer to a final voltage close to a threshold voltage, such that the repulsion applied on the wafer is less than attraction induced by at least the final voltage. Third, before the step of moving the wafer, turn off the voltage of the chuck. Fourth, during one or more (e.g., each) of the stages of the step-down dechucking method mentioned above, reduce a temperature of the gas.

Compared with the prior art, the present invention can release the gas with more control (e.g., more quickly, because, for example, gas can be removed through both the opening and the conduits or pipelines. Moreover, owing to the shape of the opening usually being of a single continuous area clearly larger than the cross-sectional area of the conduit 22, the advantage of the opening for removing gas is very clear.

Figure 4:
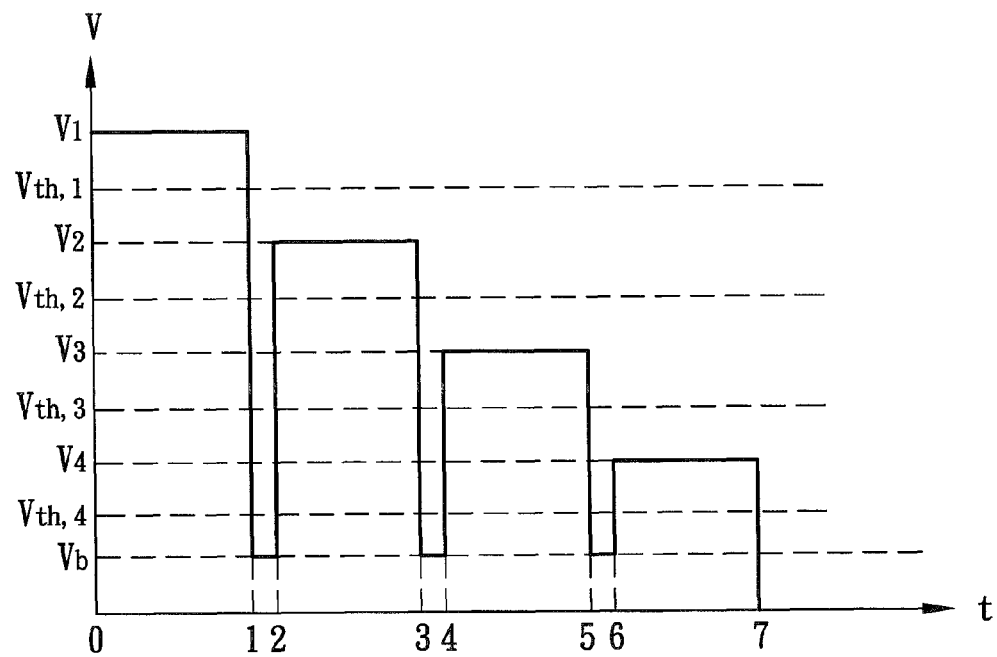
FIG. 4 is a diagram illustrating a second embodiment of the dechucking method according to the present invention.

FIG. 4 illustrates a dechucking method according to a second embodiment of the present invention, where the symbol V denotes the chucking voltage (volts) applied to the electrode(s) and the symbol t denotes the time which may be any unit, wherein t and/or V) may not be drawn to precise scale.

Similar to the first embodiment, in this embodiment the chucking voltage is gradually stepped down in multi-stages. The difference is that the chucking voltage may be reduced to a low value Vb approximate to zero or equal to zero or significantly lower than the least threshold voltage, and the reduced voltage Vb is maintained only in a short duration. Of course, the duration of reduced voltage Vb must be controlled to an extent that the displacement of the wafer is small and acceptable, damage and scarring are minimized, and/or the robot arm can still hold the wafer.

For example, when t=0, the chucking voltage V1 applied to the electrode(s) is larger than the threshold voltage Vth, 1, so that the wafer is held on the electrostatic chuck. When t=1, the chucking voltage is reduced to Vb significantly smaller than the threshold voltage Vth, 1, and the voltage Vb is maintained at a duration from t=1 to t=2, so that the wafer is pushed away from the electrostatic chuck and a portion of the gas escapes from the opening. After a portion of the gas escapes, the repulsive force gets small, and the threshold voltage gets small as well. The threshold voltage Vth, 1 is therefore changed to the threshold voltage Vth, 2. At time t=2, the chucking voltage is increased to V2 larger than the threshold voltage Vth, 2, causing the pushed wafer to be attracted and held on the electrostatic chuck again. The above-mentioned step is repeated in stages 2 (t=3 to t=4), 3 (t=5 to t=6), and so on, until the value of the threshold voltage is very low, for example, approximating 0V or equaling 0V. The very low threshold voltage means that the quantity of the residual gas is small enough (e.g., to an extent) that the residual gas is unable to push the wafer away or to push the wafer obviously away. The threshold voltage equaling 0V means that the residual gas has a final pressure value less than a threshold pressure value, wherein, the threshold pressure value may be defined as the least pressure needed to push the wafer away from the electrostatic chuck when the chucking voltage is totally turned off, or the threshold pressure value may be defined as the most pressure to push away the wafer from the electrostatic chuck to an extent that the damage is minimized and the robot arm can still catch the wafer when the chucking voltage is totally turned off. In the later case, the threshold pressure value corresponds to a final threshold voltage, Vth, f, (not shown), which is defined as the least voltage needed to hold the wafer against the electrostatic chuck when the residual gas has a threshold pressure value. Suppose that at stage 4 (t=7) the threshold voltage Vth, 4 is small enough, the chucking voltage V4 may be reduced to zero at this stage, because the threshold voltage will be lowered down to zero after a portion of the gas escapes. Then, it is suitable to move the wafer away. Note that the number of the stages is not limited.

Besides, in order to further enhance the dechucking velocity, the embodiment may further have at least one of the following steps: First, during and/or between two or more (e.g., each) of the stages of the step-down dechucking method mentioned above, continually pump gas out as usual. Second, before the step of moving the wafer, reduce the voltage of the wafer to a final voltage close to a threshold voltage, such that the repulsion applied on the wafer is less than attraction induced by at least the final voltage. Third, before the step of moving the wafer, turn off the voltage of the chuck. Fourth, during one or more (e.g., each) of the stages of the step-down dechucking method mentioned above, reduce a temperature of the gas.

Clearly, at least by referring to the two embodiments, a key characteristic of the invention is that the gas is allowed to escape through an opening between the wafer and the chuck in each stage of a multi-stage process. Moreover, in each stage, during at least a portion of the stage, the chucking voltage is reduced to a value less than the least threshold voltage needed for holding the wafer, so that the wafer is pushed away from the chuck by the gas. Hence, the gas can escape through an opening between the wafer and the chuck, thereby increasing the dechucking rate. By controlling the decrement and/or the duration of the reduced voltage, the net push-force applied on the wafer can be controlled, such that both the displacement of the wafer and the damages on the wafer can be minimized.

In the embodiment exemplified in FIG. 4, for each stage, after the reduced chucking voltage Vb is maintained for a duration of time, the chucking voltage is increased to a value lower than a chuck voltage of a previous stage. For example, the increased chucking voltage V2 is smaller than the chuck voltage V1. Hence, the embodiment is a clearly step-down dechucking method.

Figure 5:
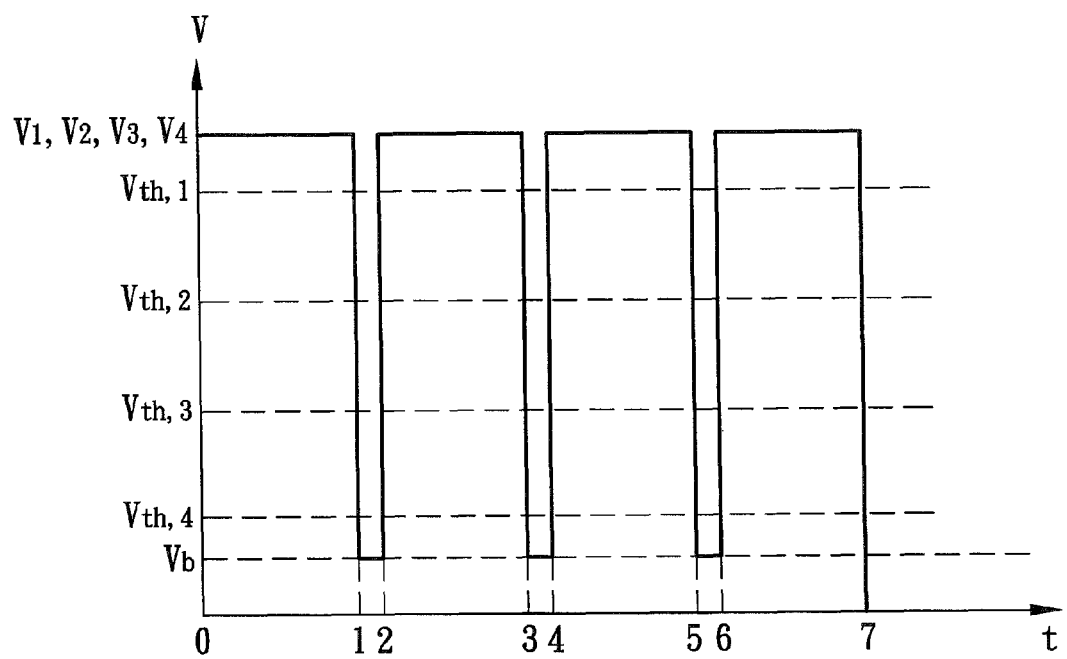
FIGS. 5-7 are diagrams illustrating variations of the second embodiment of the dechucking method according to the present invention.

Notice that the condition "increased chucking voltage is less than a previous threshold voltage" may be needless, because the only requirement is that the increased chucking voltage can effectively hold the wafer; thus, for this invention, the increased chucking voltage may be equal to a previous threshold voltage or even larger than the previous threshold voltage, as long as the increased chucking voltage is larger than the new threshold voltage corresponding to the residual gas. FIG. 5 shows an embodiment in which all of the increased chucking voltages of all stages are recovered to the same value, V1.

Figure 6:
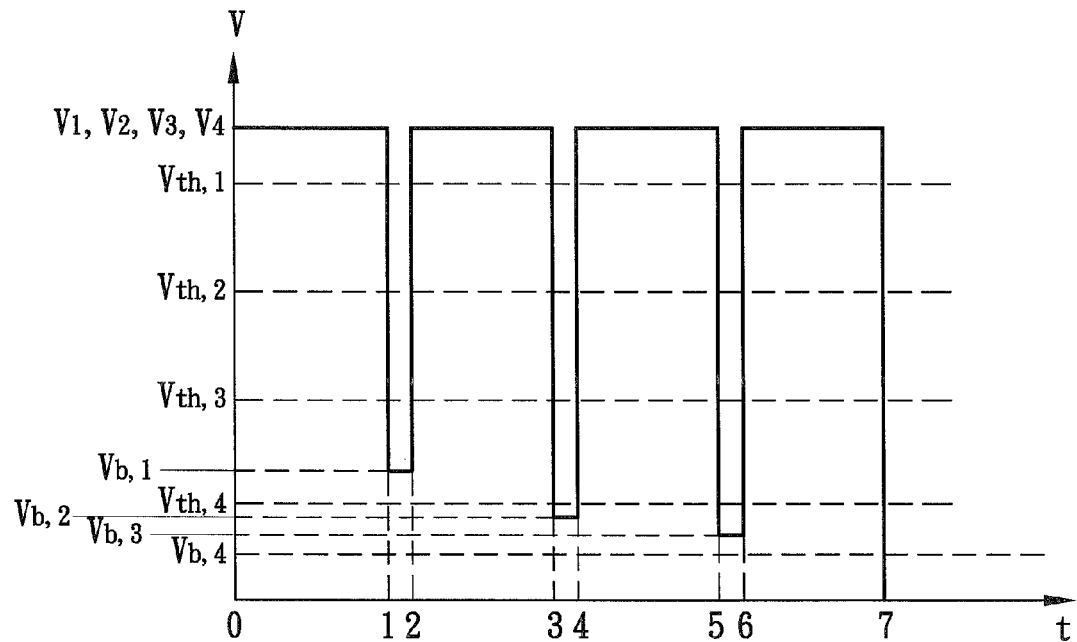

In addition, because the invention only requires a reduced chucking voltage Vb to form an opening for leaking a portion of the gas, it may be needless to reduce the chucking voltage to the same voltage Vb in each stage. In another embodiment as shown in FIG. 6, the reduced voltages Vb may be different but meet the condition that the reduced voltage Vb must be smaller than the threshold voltage in each stage. Herein, the reduced voltage Vb, 1 is less than the threshold voltage Vth, 1, the reduced voltage Vb, 2 is less than the threshold voltage Vth, 2, and so on. Herein, to enhance leakage of the gas (BSG), as usual, the difference between Vth, n and Vth, n+1 is usually obviously larger than the difference between the Vb, n and the Vb, n+1.

Figure 7:
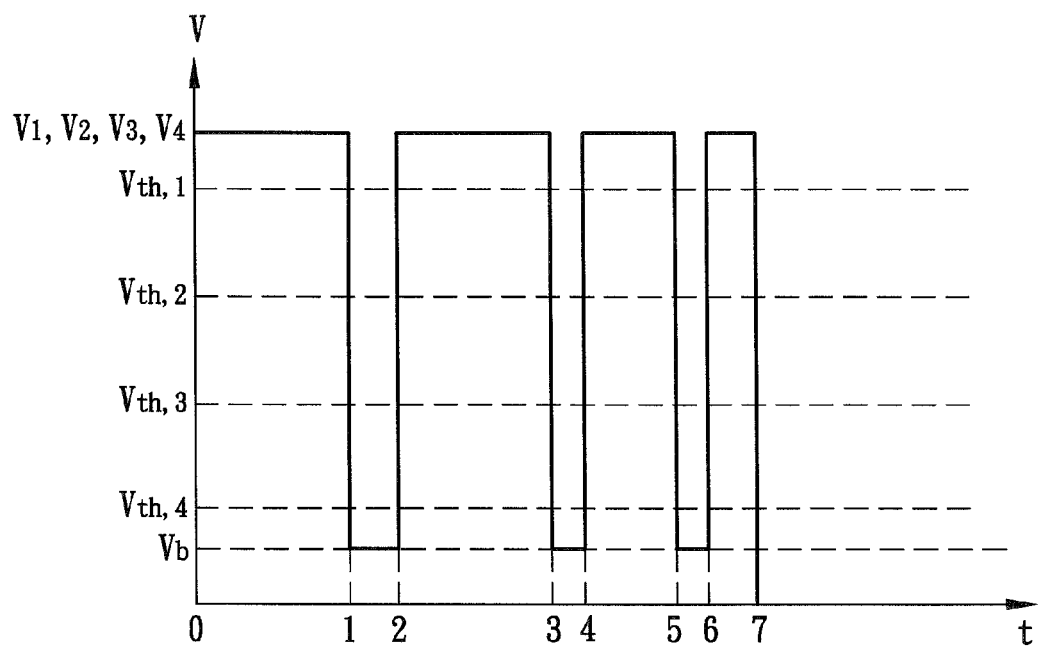

In addition, because the invention only requires a reduced chucking voltage Vb to form an opening for leaking a portion of the gas, it may be needless to maintain the reduced voltages Vb (or Vb1, Vb2 . . . ) with a same duration of time in each stage. FIG. 7 shows an embodiment where in each stage the reduced voltage Vb has a different duration. Since the quantity of the gas in stage 2 is less than the quantity of the gas in stage 1, the duration of stage 2 may be less than the duration of stage 1. Since the quantity of the gas in stage 3 is less than the quantity of the gas in stage 2, the duration of stage 3 may be less than the duration of stage 2. Herein, as will be typical, for each stage, the voltage off duration is smaller than the voltage on duration.

According to the dechucking method disclosed above, the dechucking rate is increased in a cost effective manner, and the mechanism of the electrostatic chuck is needless to be amended. The dechucking method recited above can be applied to any electrostatic chuck system, such as monopole or bipolar. Significantly, by at least adjusting the reduced voltage of each stage, the increased chucking voltage of each stage, the duration of each stage, and the repulsive force applied on the wafer is adjustable. Hence, by properly adjusting these parameters, the shape and the duration of the opening formed can be precisely adjusted, such that the gas leaking rate is controlled and the dechucking process is controllable.

For example, in the embodiment corresponding to FIG. 4, it is optional to ensure that a duration from t=1 to t=2 satisfy a limitation that a displacement of the wafer induced by an escape of a portion of the gas is smaller or enough. Hence, the wafer can be quickly held by the chuck again from t=2 to t=3. Again, it is optional to ensure from t=1 to t=2, that the reduced voltage satisfies a limitation that a displacement of the wafer induced by a difference between a repulsion induced by the residual gas and an attraction induced by the reduced voltage is smaller than a threshold displacement. Similarly, for other embodiments corresponds to FIG. 5 to FIG. 7, there are similar limitations on the reduced voltage to ensure the displacement of the wafer is acceptable.

Herein, the threshold displacement indicates a safety displacement to provide that the wafer can be moved without significant risk. As usual, the threshold displacement is limited by at least one of the following: a precision of a robot for moving the wafer, a tolerance of the robot for holding the wafer, a mechanical strength of the wafer, and an acceptable scar of the wafer. The first two items are related to the risk that the robot can not correctly and effectively hold the wafer, and the last items are related to the risk that the moved wafer collides with neighboring hardware and induces damage. Moreover, when the wafer is located on chuck, the threshold displacement can be divided into two independent displacements: a planer threshold displacement on a plane parallel to the surface of the chuck, and a Z-axis threshold displacement along an axis (Z-axis) vertical to the surface of the chuck. The reason for dividing into two displacements is that the configuration of neighboring hardware and the operation of the robot usually is divided into two portions: a portion around the chuck and a portion varied along the Z axis. The dechucking methods disclosed above are preferably applied to an implanter, wherein the implanter comprises an ion source assembly for generation an ion source, an extracting assembly for extracting a plurality of ions from the ion source, an analysis magnetic assembly for adjusting the ions into an ion beam, and a mechanical assembly for supporting and moving a wafer to be implanted by the ion beam. The mechanical assembly can comprise an electrostatic chuck for holding the wafer, and the implanter (e.g., the mechanical assembly) may further comprise a controller capable of controlling at least a portion of said implanter to adjust the chucking voltage of the electrostatic chuck.

Herein, the structure/technique pertaining to achievement of the controller is not limited. It can be an application specific integrated circuit, it can be a computer executable problem loaded in a memory, it can be firmware loaded in a flash, and it can be a circuit embedded in the implanter, and so on. Moreover, it can be an interface receiving instructions from an external computer or an operator of the implanter.

Although specific embodiments have been illustrated and described, it will be appreciated by those skilled in the art that various modifications may be made without departing from the scope of the present invention, which is intended to be limited solely by the appended claims.

What is claimed is:

1. A method for dechucking an electrostatic chuck, comprising:
   (a) holding a wafer with an electrostatic chuck, wherein a gas is located in a space between said wafer and said electrostatic chuck, wherein a repulsion applied on said wafer by said gas is less than an attraction applied on said wafer by at least a voltage of said electrostatic chuck;
   (b) reducing said voltage of said electrostatic chuck, such that said wafer is pushed away from said electrostatic chuck and at least a portion of said gas escapes;
   (c) increasing the voltage of said electrostatic chuck, such that a repulsion applied on said wafer by a residual gas is less than an attraction applied on said wafer by at least said voltage;
   (d) repeating steps (b) and (c) until a final residual gas located in said space has a final pressure value less than a threshold pressure value; and
   (e) moving said wafer away from said electrostatic chuck.

2. The method as set forth in claim 1, wherein a duration of said step (b) satisfies a limitation that a displacement of said wafer induced by an escape of a portion of said gas is sufficiently small such that said wafer can be quickly held by said electrostatic chuck in said step (c).

3. The method as set forth in claim 1, further comprising one or more of the following steps:
   reducing the voltage of said wafer to a final voltage close to a threshold voltage, wherein a repulsion applied on said wafer by said final pressure value is less than an attraction induced by at least said final voltage, after step (d) and before step (e);
   turning off said voltage after step (d) and before step (e);
   pumping said gas away from said space during said steps (b) and (c); and
   reducing a temperature of said gas during said steps (b) and (c).

4. The method as set forth in claim 1, for each step (b), said reduced voltage satisfying a limitation that a displacement of said wafer induced by a difference between a repulsion induced by said residual gas and an attraction induced by said reduced voltage is smaller than a threshold displacement.

5. The method as set forth in claim 4, wherein said threshold displacement is limited by one or more of the following:
   a precision of a robot for moving said wafer;
   a tolerance of said robot for holding and moving said wafer;
   a mechanical strength of said wafer; and
   an acceptable degree of scarring of said wafer.

6. A method for dechucking an electrostatic chuck, comprising:
   (a) holding a wafer with an electrostatic chuck, wherein a gas is located in a space between said wafer and said electrostatic chuck, wherein a repulsion applied on said wafer by said gas is less than an attraction applied on said wafer by at least a voltage of said electrostatic chuck;
   (b) reducing said voltage of said electrostatic chuck, such that said wafer is pushed away from said electrostatic chuck and at least a portion of said gas escapes;
   (c) holding said wafer by said electrostatic chuck again when a repulsion applied on said wafer by a residual gas located in said space is less than an attraction applied on said wafer by at least said voltage;
   (d) repeating steps (b) and (c) until a final residual gas located in said space has a final pressure value less than a threshold pressure value; and
   (e) moving said wafer away from said electrostatic chuck.

7. The method as set forth in claim 6, further comprising one or more of the following steps:
   reducing the voltage of said wafer to a final voltage close to a threshold voltage, wherein a repulsion applied on said wafer by said final pressure value is less than an attraction induced by at least said final voltage, after step (d) and before step (e);
   turning off said voltage after step (d) and before step (e);
   pumping said gas away from said space during said steps (b) and (c); and
   reducing a temperature of said gas during said steps (b) and (c).

8. The method as set forth in claim 6, for each step (b), said reduced voltage satisfying a limitation that a displacement of said wafer induced by a difference between the repulsion induced by said residual gas and the attraction induced by said reduced voltage is smaller than a threshold displacement.

9. The method as set forth in claim 8, wherein said threshold displacement is limited by one or more of the following:
   a precision of a robot for moving said wafer;
   a tolerance of said robot for holding and moving said wafer;
   a mechanical strength of said wafer; and
   an acceptable amount or susceptibility of scarring of said wafer.

10. The method as set forth in claim 8, wherein said threshold displacement comprises one or more of the following:
    a planer threshold displacement; and
    Z-axis threshold displacement.

11. An implanter, comprising:
    an ion source assembly for generating an ion source;
    an extracting assembly for extracting a plurality of ions from said ion source;
    an analysis magnetic assembly for adjusting said ions into an ion beam; and
    a mechanical assembly for supporting and moving a wafer to be implanted by said ion beam, comprising:
    an electrostatic chuck for holding said wafer; and
    a controller capable of controlling at least a portion of said implanter to adjust the voltage of said electrostatic chuck and perform the following steps:
    (a) holding a wafer with an electrostatic chuck, wherein a gas is located in a space between said wafer and said electrostatic chuck, wherein a repulsion applied on said wafer by said gas is less than an attraction applied on said wafer by at least a voltage of said electrostatic chuck;

(b) reducing said voltage of said electrostatic chuck, such that said wafer is pushed away from said electrostatic chuck and at least a portion of said gas escapes;

(c) increasing the voltage of said electrostatic chuck such that a repulsion applied on said wafer by a residual gas is less than an attraction applied on said wafer by at least said voltage, or, holding said wafer by said electrostatic chuck again when a repulsion applied on said wafer by a residual gas located in said space is less than an attraction applied on said wafer by at least said voltage;

(d) repeating steps (b) and (c) until a final residual gas located in said space has a final pressure value less than a threshold pressure value; and (e) moving said wafer away from said electrostatic chuck.

12. The implanter as set forth in claim 11, wherein a duration of said step (b) satisfies a limitation that a displacement of said wafer induced by an escape of a portion of said gas is small enough to enable said wafer to be quickly held by said electrostatic chuck in said step (c).

13. The implanter as set forth in claim 11, further comprising one or more of the following steps:

reducing the voltage of said wafer to a final voltage close to a threshold voltage, wherein a repulsion applied on said wafer by said final pressure value is less than an attraction induced by at least said final voltage, after step (d) and before step (e);

turning off said voltage after step (d) and before step (e);

pumping said gas away from said space during said steps (b) and (c); and reducing a temperature of said gas during said steps (b) and (c).

14. The implanter as set forth in claim 11, wherein for each step (b), said reduced voltage satisfies a limitation that a displacement of said wafer induced by a difference between a repulsion by said residual gas and an attraction by said reduced voltage is smaller than a threshold displacement.

15. The implanter as set forth in claim 14, wherein said threshold displacement is limited by one or more of the following:

a precision of a robot for moving said wafer;

a tolerance of said robot for holding and moving said wafer;

a mechanical strength of said wafer; and an acceptable degree of or vulnerability to scarring of said wafer.

16. The implanter as set forth in claim 11, further comprising one or more of the following steps:

reducing the voltage of said wafer to a final voltage close to a threshold voltage, wherein a repulsion applied on said wafer by said final pressure value is less than an attraction induced by at least said final voltage, after step (d) and before step (e);

turning off said voltage after step (d) and before step (e);

pumping said gas away from said space during said steps (b) and (c); and reducing a temperature of said gas during said steps (b) and (c).

17. The implanter as set forth in claim 11, wherein, for each step (b), said reduced voltage satisfies a limitation that a displacement of said wafer induced by a difference between the repulsion induced by said residual gas and the attraction induced by said reduced voltage is smaller than a threshold displacement.

18. The implanter as set forth in claim 17, wherein said threshold displacement is limited by one or more of the following:

a precision of a robot for moving said wafer;

a tolerance of said robot for holding and moving said wafer;

a mechanical strength of said wafer; and an acceptable scarring of said wafer.

* * * * *